United States Patent [19]

Fredericks et al.

[11] Patent Number: 4,567,132
[45] Date of Patent: Jan. 28, 1986

[54] MULTI-LEVEL RESIST IMAGE REVERSAL LITHOGRAPHY PROCESS

[75] Inventors: Edward C. Fredericks, Haymarket; Herbert L. Greenhaus; Madan M. Nanda, both of Reston; Giorgio G. Via, McLean, all of Va.

[73] Assignee: International Business Machines Corporation, Armonk, N.Y.

[21] Appl. No.: 590,092

[22] Filed: Mar. 16, 1984

[51] Int. Cl.$^4$ .................................................. G03F 7/26
[52] U.S. Cl. .................................... 430/312; 430/156; 430/315; 430/324; 430/325; 430/328; 430/329; 430/330
[58] Field of Search ............... 430/312, 156, 325, 326, 430/328, 330, 315, 324

[56] References Cited

U.S. PATENT DOCUMENTS

| 2,702,243 | 2/1955 | Schmidt | 430/156 |
| 3,152,900 | 10/1964 | Kaus et al. | 430/23 |
| 4,104,070 | 8/1978 | Moritz et al. | 430/312 |
| 4,154,613 | 5/1979 | Doering | 430/24 |
| 4,211,834 | 7/1980 | Lapadula et al. | 430/326 |
| 4,238,559 | 12/1980 | Feng et al. | 430/156 |
| 4,352,870 | 10/1982 | Howard et al. | 430/156 |
| 4,373,018 | 2/1983 | Reichmanis | 430/156 |

FOREIGN PATENT DOCUMENTS 32635 2/1982 Japan .................................. 430/312

OTHER PUBLICATIONS

Romankiw, L. T., et al., *IBM Tech. Discl. Bulletin.*, vol. 18, No. 12, pp. 4219–4221, 5/1976.
Lin. B. J., et al., *J. Vac. Sci. Tech.* 19(4), 11-12/1981, pp. 1313-1319.
Griffing, B. F., *J. Vac. Sci. Tech.* 19(4), 11-12/1981, pp. 1423-1428.
Lin, B. J., *IBM Tech. Discl. Bulletin*, vol. 21, No. 5, 10/1978, p. 2133.
Horng, C. T. et al., *IBM Tech. Discl. Bulletin*, vol. 26, No. 3B, 8/1983, p. 1731.

Primary Examiner—Charles L. Bowers, Jr.
Attorney, Agent, or Firm—John E. Hoel

[57] ABSTRACT

A photoresist photolithographic process is disclosed which provides for a single development step to develop a dual layer photoresist for lift-off, reactive ion etching, or ion implantation processes requiring a precise aperture size at the top of the photoresist layer.

The process involves the deposition of two compositionally similar layers, with the first layer having the characteristic of being soluble in a developer after exposure to light and baking, and the second layer having the characteristic of being insoluble in the same developer after having been exposed to light and baked. With these two distinct characteristics for the two layers of photoresist, the effective aperture for windows in the composite photoresist can be tightly controlled in its cross-sectional dimension in the face of large variations in the developer concentration and development time.

2 Claims, 14 Drawing Figures

FIG. 11
NORMAL DEVELOPMENT

FIG. 12
OVER DEVELOPMENT

MULTI-LEVEL RESIST IMAGE REVERSAL LITHOGRAPHY PROCESS

DESCRIPTION

1. Field of the Invention

The invention disclosed broadly relates to semiconductor processing and more particularly relates to improvements in photolithography.

2. Background of the Invention

Semiconductor fabrication processes rely heavily upon photolithographic techniques. In photolithography, the masking layer of photoresist material is formed on the surface of a substrate of semiconductor material, insulating material, or metallic material, so as to enable portions of the photoresist material to be opened, thereby exposing the underlying material to process steps such as ion implantation, wet chemical etching, plasma or reactive ion etching, and various metal deposition techniques. The photoresist material is a photosensitive organic solution or mixture whose relative solubility can be changed by exposure to light in the visible, ultraviolet or x-ray portion of the spectrum, or by exposure to corpuscular radiation such as electrons in an electron beam. By exposing the photosensitive photoresist material with a predefined pattern of such radiation, the desired pattern of openings in the photoresist material can be obtained.

There are two generic types of photoresist materials which can be classified according to their interaction with light, the first type being a negative photoresist and the second type being a positive photoresist system. In a positive working photoresist system, the photoresist is altered upon exposure in such a manner that it is subsequently soluble in a developer such as aqueous buffered alkali. The exposed areas of the photoresist film are removed upon developing, with the unprotected areas on the substrate surface corresponding to the transparent parts of a photo mask through which the light was transmitted. Examples of positive working photoresist systems are photoresist materials based upon phenol-formaldehyde resins of the novolak type, with a suitable molecular weight distribution, which contain a photo active compound called a sensitizer, for instance of the group of the four or five-substituted diazo-naphthoquinones, such as naphthoquinone (1,2)-diazide-sulfonic acid esters.

The term negative photoresist refers to a photoresist which, after exposure to the aforementioned radiation, is not soluble whereas the unexposed zones are dissolved by the developer. As a result, free and unprotected zones are obtained on the substrate surface which correspond to the opaque parts of the photo mask through which the light was transmitted. An example of a negative photoresist is given in U.S. Pat. No. 4,104,070 to Moritz, et al, assigned to the instant assignee. In the Moritz patent, a positive working photoresist such as that described above, is mixed with one percent by weight of the compound 1-hydroxyethyl-2-alkyl imidazoline. The resulting photoresist mixture has the property of becoming insoluble when exposed to ultraviolet light and processed in accordance with the Moritz patent. The solvent developer which will dissolve the optically exposed portions of the positive photoresist system described above, is an aqueous buffered alkali, for example, and this solvent developer will not dissolve the negative photoresist system described above, in those portions which have been exposed to the same ultraviolet light.

A problem which occurs with prior art negative photoresists, is that after they have been exposed to light and the exposed portions developed, the resultant sidewalls of the photoresist structures are relatively straight and are either substantially perpendicular with respect to the substrate or lie at a relatively shallow angle with respect to the perpendicular direction to the substrate. This creates a problem in performing a lift-off process subsequent to the formation of the photoresist structures, wherein metal is vacuum evaporated onto all exposed surfaces and those portions of the metal which are permitted to pass through openings in the photoresist layer so as to deposit on the substrate, form undesirable spur structures along the substantially vertical sidewalls of the photoresist structure. This undesirable result of the rather shallow inclination which is undercut in the sidewall of the photoresist structures, results in electrical shorts or electrical punch-through of dielectric material subsequently deposited on the metal structures. As the minimum size of metal structures which are possible to fabricate in semiconductor technology decreases to the one micron dimension, these undesirable spur structures become a significant defect which substantially reduces the yield of the resultant semiconductor product. Another problem which arises with photoresist materials of the prior art is the inability of such materials to provide suitable mask openings as the dimensions of the mask openings decrease. Typically, the thickness of a photoresist layer is approximately one micron and as the minimum cross-sectional dimension of the mask openings which are desired to be fabricated also approaches one micron, it becomes progressively more difficult to completely clean out the bottom of the apertures formed in the photoresist layer after development. Typically, what must be done is to over develop the photoresist material so as to effectively clean out the bottom of the openings which are desired in the photoresist layer. However, by over developing the photoresist layer, the effective dimension of the aperture becomes progressively more difficult to control so that the inherently large tolerances involved in the over development of photoresists limits the amount of reduction which can be achieved in the dimensions of the resultant apertures.

OBJECTS OF THE INVENTION

It is therefore an object of the invention to provide an improved photolithographic process.

It is another object of the invention to provide an improved photolithographic process which results in smaller apertures than have been available in the prior art.

It is another further object of the invention to provide an improved negative photoresist process which reduces the occurrence of the formation of a foot of the photoresist material at the base of the sidewall of the photoresist structure.

It is still a further object of the invention to provide an improved negative photoresist process which reduces the occurrence of the formation of spur structures along the sidewall of the aperture in the photoresist during the vacuum deposition of a metal layer in the aperture.

It is still a further object of the invention to provide an improved negative photoresist process which results in minimum cross-sectional dimension apertures suitable for lift-off deposition steps for the formation of metal, insulator, or semiconductor structures.

It is yet a further object of the invention to provide an improved negative photoresist fabrication process which forms minimum cross-sectional size apertures in the photoresist suitable for use in wet chemical etching or dry plasma or reactive ion etching operations.

It is yet a further object of the invention to provide an improved negative photoresist fabrication process which results in producing apertures in the photoresist material whose effective cross-sectional dimension is relatively insensitive to over development of the photoresist.

It is still a further object of the invention to provide an improved negative image photoresist which has a minimum tolerance in the dimension of the apertures produced therein.

SUMMARY OF THE INVENTION

These and other objects, features and advantages of the invention are accomplished by the photolithographic process disclosed herein. A photoresist photolithographic process is disclosed which provides for a single development step to develop a dual layer photoresist for lift-off, reactive ion etching, or ion implantation processes requiring a precise aperture size at the top of the photoresist layer.

The process involves the deposition of two compositionally similar layers, with the first layer having the characteristic of being soluble in a developer after exposure to light and baking, and the second layer having the characteristic of being insoluble in the same developer after having been exposed to light and baked. With these two distinct characteristics for the two layers of photoresist, the effective aperture for windows in the composite photoresist can be tightly controlled in its cross-sectional dimension in the face of large variations in the developer concentration and development time.

DESCRIPTION OF THE FIGURES

These and other objects, features and advantages of the invention will be more fully appreciated with reference to the accompanying figures.

DISCUSSION OF THE PREFERRED EMBODIMENT

Figure 1:
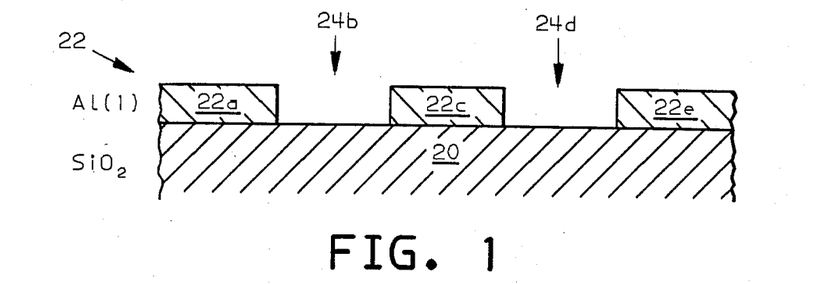
FIG. 1 is a cross-sectional view of the substrate upon which the photoresist lift-off structure is to be fabricated in accordance with the invention.
Figure 8:
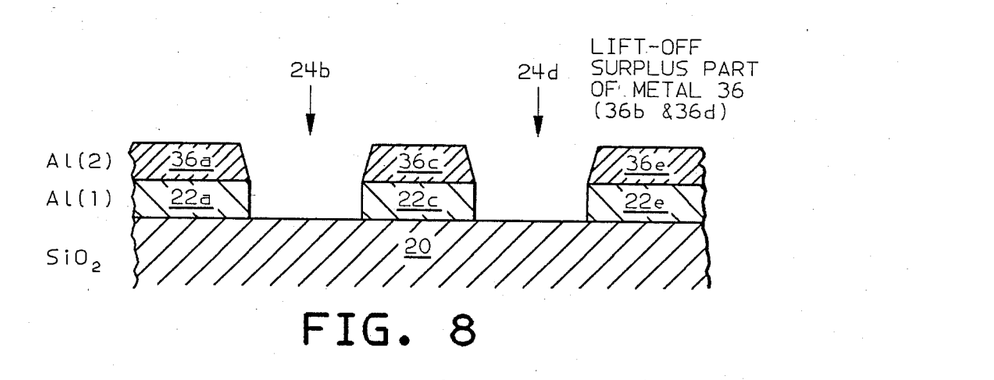
FIG. 8 shows the next step in the metal lift-off process of FIG. 7, wherein the surplus portions 36b and 36d of the metal layer 36 have been lifted off of the structure leaving the remaining portions 36a, 36c and 36e of the metal layer 36.

The invention will now be described in detail. The sequence of cross-sectional views in FIGS. 1-6 illustrate the fabrication process for the formation of the photoresist structures shown in FIG. 6, in accordance with the invention. Reference to the process flow diagram of FIG. 13 will illustrates the sequence of operational steps necessary to carry out the fabrication process in accordance with the invention. FIG. 1 is a cross-sectional view of a silicon dioxide substrate 20 upon which has been formed a layer 22 of aluminum which has been patterned to form the portions 22a and 22c which are separated by an exposed area 24b. An additional aluminum portion 22e is separated from the portion 22c by the region 24d. To illustrate the process sequence, it is desired to form a photoresist structure which occupies the exposed region 24b and a second photoresist structure which occupies the exposed portion 24d. In order to further illustrate the utility of the resultant photoresist structures, the structures will be formed to facilitate the metal lift-off process to form a second aluminum layer to be deposited on top of each of the three portions 22a, 22c and 22e. The desired final structure is shown in FIG. 8, wherein it can be seen that the aluminum layer 36 has been deposited on top of the aluminum layer 22 so that the portions 36a, 36c and 36e are each respectively deposited on top of the existing portions 22a, 22c and 22e. The sequence of process steps necessary to carry out the formation of the photoresist structure shown in FIG. 6 which will then enable the metal lift-off process to take place forming the metal structures shown in FIG. 8, can be seen from a review of the process flow diagram of FIG. 13.

Figure 13:
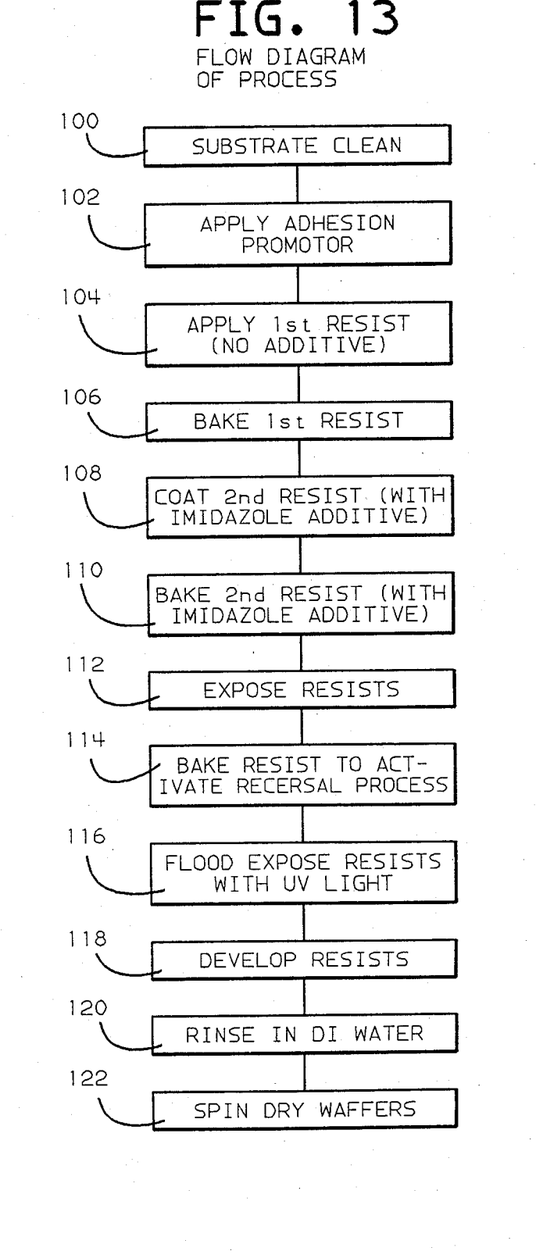
FIG. 13 illustrates a process flow diagram for the process invention.

In FIG. 13, a first step 100 is applied to the beginning structure shown in FIG. 1, of cleaning the substrate with a suitable solvent such as boiling ethanol, followed by a rinse in deionized water.

The next step 102 shown in the process flow diagram of FIG. 13 is the application of an adhesion promoter onto all exposed surfaces of the structure shown in FIG. 1. A suitable adhesion promoter can be for example hexa methyl di-silizane (HMDS).

Figure 2:
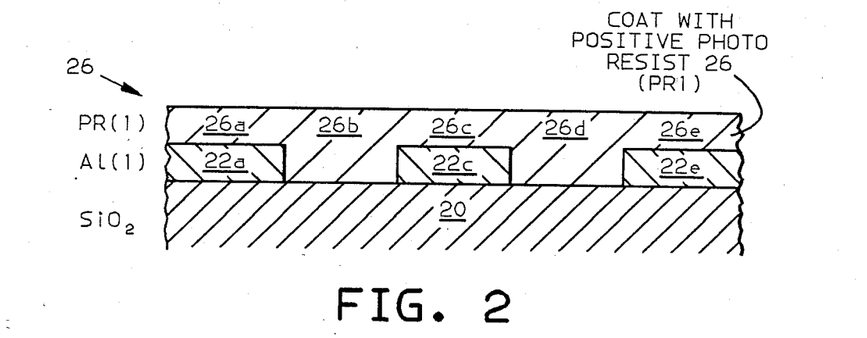
FIG. 2 is a cross-sectional view of the substrate of FIG. 1, after the layer of positive photoresist 26 has been deposited thereon.

The next step 104 in the process diagram of FIG. 13 refers to FIG. 2, wherein the structure of FIG. 1 is coated with a layer of approximately 1.0 micron thickness of a positive photoresist 26, which can be briefly referred to as PR(1). The positive working photoresist layer 26 is for example a phenol-formaldehyde resin with a diazo-naphthoquinone sensitizer which is described in U.S. Pat. No. 3,201,239. As can be seen in FIG. 2, the coating 26 is approximately 1.0 micron in thickness and the regions 26a, 26c and 26e which are each respectively lying upon the aluminum portions 22a, 22c and 22e. The portions 26b and 26d of the photoresist layer 26 which lie in the exposed open areas 24b and 24d, respectively, will have a thicker dimension. If, for example, the layer 22 of aluminum is approximately 1.0 micron in thickness, then the overall thickness of the layer 26 in the regions 26b and 26d, will be approximately 2.0 microns in thickness.

The next step 106 shown in FIG. 13 is a short duration baking step of the photoresist layer 26 in order to remove its tackiness. Suitable baking conditions would be to place the structure in an oven at from 80°–100° C. for from two to 30 minutes. This duration and temperature should be long enough to partially solidify the resist and remove its tackiness without substantially changing the photosensitivity of the resist.

Figure 3:
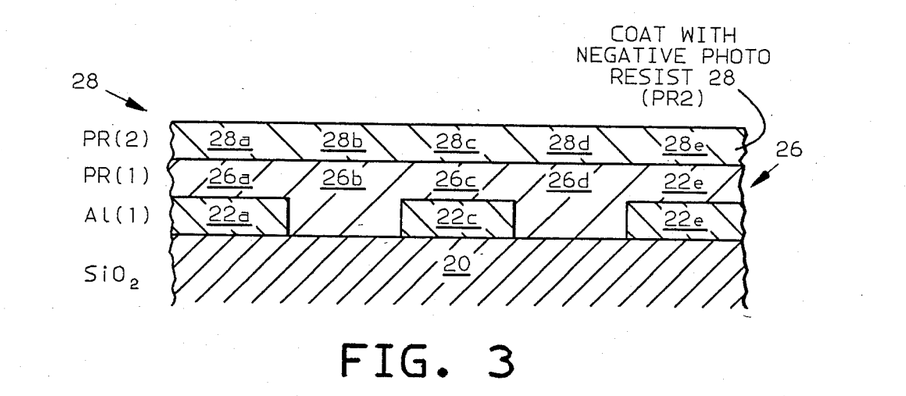
FIG. 3 a cross-sectional view of the structure shown in FIG. 2, after the deposition of the negative photoresist layer 28 has been made thereon.

The next step 108 shown in the process flow diagram of FIG. 13 refers to the cross-sectional structure of FIG. 3, and calls for applying the coating 28 of negative photoresist which can be briefly referred to as the coating PR(2). The negative photoresist layer 28 can be formed from a positive working photoresist such as the phenol formaldehyde resin with a diazo-naphthoquinone sensitizer referred to above and which is described in U.S. Pat. No. 3,201,239, which is then mixed with one percent by weight of 1-hydroxyethyl-2-alkyl imidazoline, as is described in U.S. Pat. No. 4,104,070. The imidazoline constituent can be briefly referred to as "imadazol" herein, and can have a range of from one to five percent by weight in the mixture.

The interface at 27 between the positive photoresist layer 26 and the negative photoresist layer 28 represents some intermixing of the respective photoresists of these two layers. Typically from one-fourth to one-third of the adjacent portion of each layer at the interface 27 intermixes, providing a gradation between the positive quality of the photoresist layer 26 and the negative quality of the photoresist layer 28.

The next step 110 in the flow diagram of FIG. 13 calls for another short duration baking step for the composite photoresist layers, in order to remove the tackiness of the negative photoresist layer 28. The structure of FIG. 3 can be placed in an oven and baked at a temperature of from 80°–100° C. for from two to 30 minutes.

Both the first photoresist layer 26 and the second photoresist layer 28 can be applied by a spin coating technique, for example. The second photoresist layer 28 will typically be formed to a thickness of approximately 1.0 micron.

As can be seen in FIG. 3, the second photoresist layer 28 has portions 28a–28e which each respectively lie upon a corresponding portion 26a–26e of the first photoresist layer 26.

Figure 4:
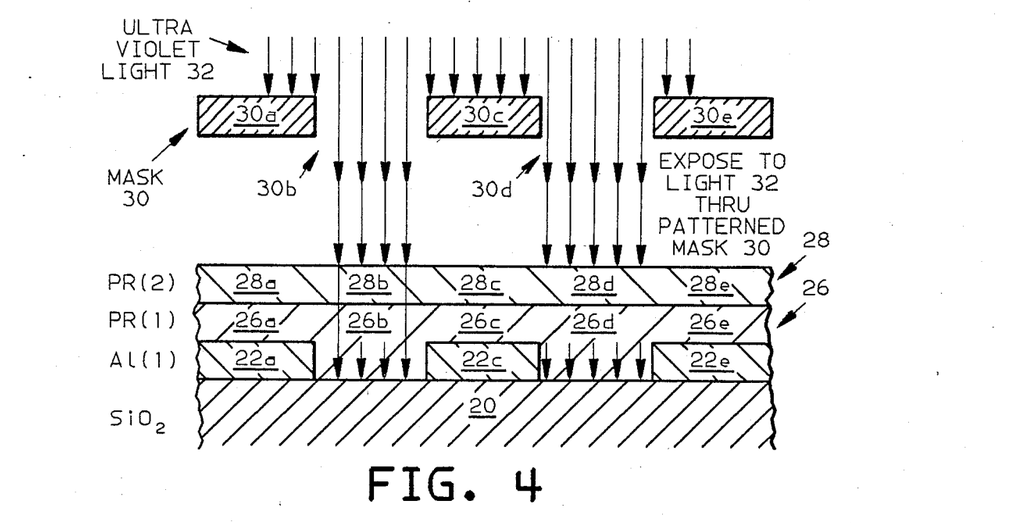
FIG. 4 is a side cross-sectional view of the structure shown in FIG. 3, aligned with the optical mask 30 so that the ultraviolet light 32 can penetrate through apertures in the mask 30 and expose corresponding portions of the composite layers of photoresist 28 and 26.

The flow diagram of FIG. 13 next shows the step 112 which is illustrated in FIG. 4, of exposing the composite photoresist layers 26 and 28 to ultraviolet light which is patterned by means of the mask 30. The mask 30 is divided into the opaque portions 30a, 30c and 30e and is further divided into the transparent portions 30b and 30d. The transparent window 30b is positioned over the portion 28b of the negative photoresist layer 28 and the portion 26b of the positive photoresist layer 26. Similarly, the transparent window 30d of the mask 30 is positioned over the portion 28d of the negative photoresist layer 28 and the portion 26d of the positive photoresist layer 26. Then, ultraviolet light 32 is made incident upon the mask 30 and is transmitted through the transparent windows 30b and 30d so as to penetrate the portions of the photoresist layers 28 and 26, as is shown in FIG. 4. The ultraviolet light applied to the photoresist layers in this step 112 has an energy density in the range of from 80 to 150 millijoules per square centimeter and the preferred value is approximately 100 millijoules per square centimeter, and can be produced from a source such as a mercury high pressure lamp.

Figure 5A:
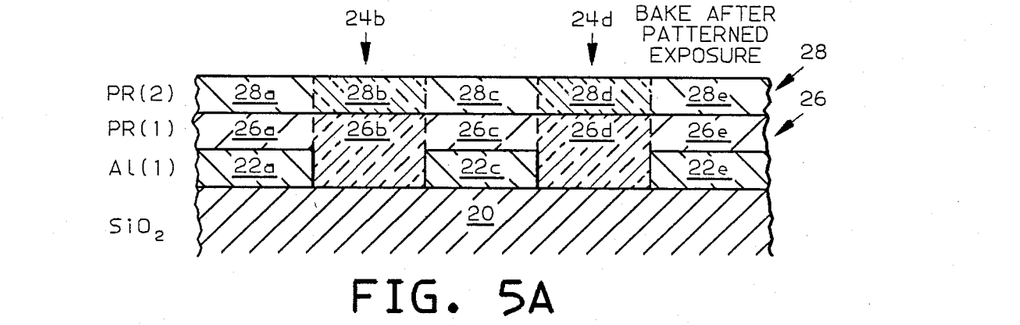
FIG. 5A is a side cross-sectional view of the structure shown in FIG. 4, after having been baked so as to activate the exposed portions 26b and 26d of the positive photoresist layer 26 and the portions 28b and 28d of the negative photoresist layer 28 which were exposed to the ultraviolet light in the step shown in FIG. 4.

The effect of the ultraviolet light 32 in step 112 on the negative photoresist layer 28 in the exposed regions 28b and 28d is to decompose the sensitizer in the photoresist, such as decomposing the diazo-naphthoquinone sensitizer so as to form indene carboxylic acid under the influence of the ultraviolet light. Subsequently, as is indicated in step 114 of the flow diagram of FIG. 13, the photoresist composite is baked as illustrated in FIG. 5A, and those areas 28b and 28d where the layer 28 was exposed to the ultraviolet light 32, there will be a cross linking. The cross linking in the exposed portions of the negative photoresist layer 28 renders the photoresist insoluble by means of the baking process of step 114.

Figure 5B:
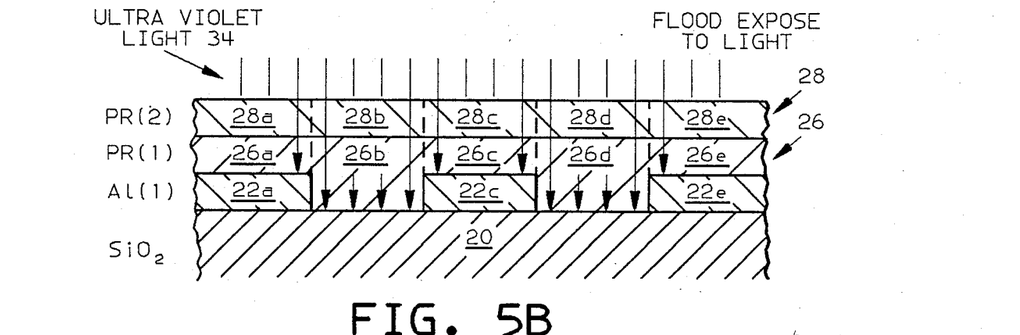
FIG. 5B shows a cross-sectional view of the structure shown in FIG. 5A, wherein the composite photoresist layers 26 and 28 are flood exposed to the ultraviolet light 34.
Figure 6:
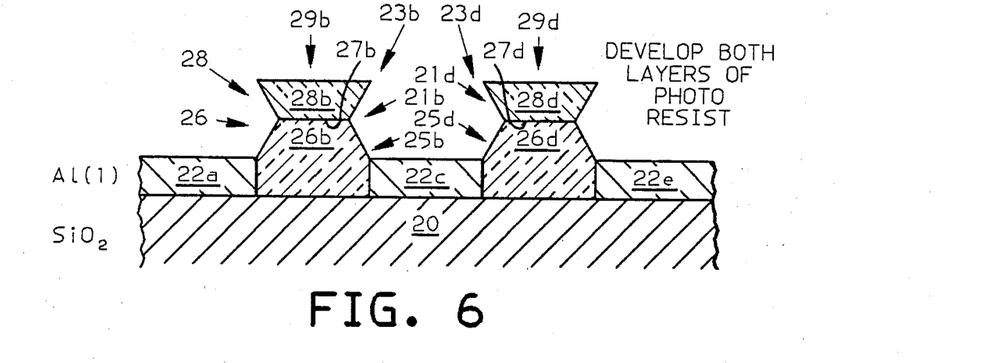
FIG. 6 is a side cross-sectional view of the structure shown in FIG. 5B, after the composite layers of photoresist 26 and 28 have been developed so as to remove those portions of the two photoresist layers which were not exposed to the ultraviolet light in the step shown in FIG. 4.

As is further indicated in step 116 of the flow diagram of FIG. 13, after the baking step 114 corresponding to FIG. 5A, a flood exposure of the photoresist takes place in FIG. 5B using the ultraviolet light 34 without a mask. The ultraviolet light in this step 116 has an energy density of from 400 to 2000 millijoules per square centimeter and the preferred value is 400 millijoules per square centimeter. This energy density is approximately four times that in step 112, above. The areas 28b and 28d of the negative photoresist layer 28 which were previously exposed in step 112 through the mask 30 to the ultraviolet light 32 in FIG. 4, and which were rendered insoluble through the baking step 114 shown in FIG. 5A, do not react any further. However, for those areas 28a, 28c and 28e of the negative photoresist layer 28 which were previously covered by the mask 30 in FIG. 4, the diazonaphthoquinone sensitizer will be degraded during the blanket ultraviolet light exposure of step 116 and FIG. 5B. Because of this degrading process, the areas 28a, 28c and 28e are rendered soluble in an alkaline developer such as potassium hydroxide, sodium metasilicate, and sodium hydroxide. As a result, FIG. 6 shows that the portions 28a, 28c and 28e of the negative photoresist layer 28 have been removed after the step 118 of developing the resist in an alkaline developer has taken place, as indicated in the flow diagram of FIG. 13. In contrast, the portions 28b and 28d of the negative photoresist layer 28 are shown in FIG. 6 as remaining intact after the development step 118 using the alkaline developer, as indicated in the flow diagram of FIG. 13.

Returning to FIG. 4, the effect of the ultraviolet light 32 which impinges in step 112 upon the exposed portions 26b and 26d of the positive photoresist layer 26 is to render the portions 26b and 26d more soluble in an alkaline developer. However, the optical density of the portions 28b and 28d of the upper, negative photoresist layer 28 diminishes the intensity of the ultraviolet light 32 which penetrates in step 112 into the lower positive photoresist portions 26b and 26d of the layer 26. Thus, the bulk of the lower portions 26b and 26d of the positive photoresist layer 26 receive a progressively decremented intensity of radiation in step 112 which forms a negative profile in the developed image. In the step 114 following FIG. 4, the structure of FIG. 5A is baked, as was described above, and this has the effect on the positive photoresist portions 26b and 26d of only drying those portions without any substantial change in the relative solubility thereof in an alkaline developer, over the increased solubility which resulted from the ultraviolet light exposure of step 112 in FIG. 4. In the next step 116 of FIG. 5B, the blanket or flood exposure to ultraviolet light 34 penetrates through the previously unexposed portions 28a, 28c and 28e of the negative photoresist layer 28 with a greater degree of transmission than does the ultraviolet light 34 penetrating through the previously exposed portions 28b and 28d of the negative photoresist layer 28. Apparently, the optical density of the previously exposed portions 28b and 28d of the negative photoresist layer 28 is greater than the optical density of the previously unexposed portions 28a, 28c and 28e of the negative photoresist layer 28. Thus, the energy density of the ultraviolet light 34 which is transmitted in step 116 into the portions 26a, 26c and 26e of the positive photoresist layer 26 is greater than the energy density of the ultraviolet light 34 which penetrates into the portions 26b and 26d of the positive photoresist layer 26. The energy density of the light 34 in the blanket exposure step 116 is approximately four times greater than the energy density of the light 32 in the masked exposure step 112. This has the effect of rendering the portions 26a, 26c and 26e of the positive photoresist layer 26 more soluble in the subsequently applied alkaline developer, than will be the portions 26b and 26d of the positive photoresist layer 26. As a result, when the composite layers 28 and 26 are immersed in step 118 in an aqueous alkaline developer such as potassium hydroxide or sodium hydroxide, the portions 26a, 26c and 26e of the positive photoresist layer 26 are removed as is shown in FIG. 6. Correspondingly, although the portions 26b and 26d of the positive photoresist layer 26 are more soluble in the aqueous alkaline developer of step 118 than are portions 28b and 28d of the negative photoresist layer 28, the portions 26b and 26d are less soluble than are the portions 26a, 26c and 26e of the positive photoresist layer 26. Thus, the composite photoresist structure 26b, 28b and the composite photoresist structure 26d, 28d are thereby formed as is shown in FIG. 6.

Although the exact mechanism for the increased optical density of the portions 28b and 28d of the negative photoresist layer 28 which have been exposed in step 112 to ultraviolet light 32, are not fully understood, it is believed that additional optical absorption centers are formed during the cross linking process which was described above, quite possibly by the formation of uncombined free radical centers or other optically active scattering or absorption sites which are not otherwise formed in the portions 28a, 28c and 28e which are masked during step 112. It is the increased relative optical density in the portions 28b and 28d which apparently provides for a reduced effectiveness of the ultraviolet light 34 exposure during step 116 in FIG. 5B on the underlying portions of the positive photoresists 26b and 26d.

The step 120 of rinsing the developed structures in de-ionized water and the step 122 of spin drying the wafer, as shown in FIG. 13, completes the process of forming the photoresist mask shown in FIG. 6.

Figure 9:
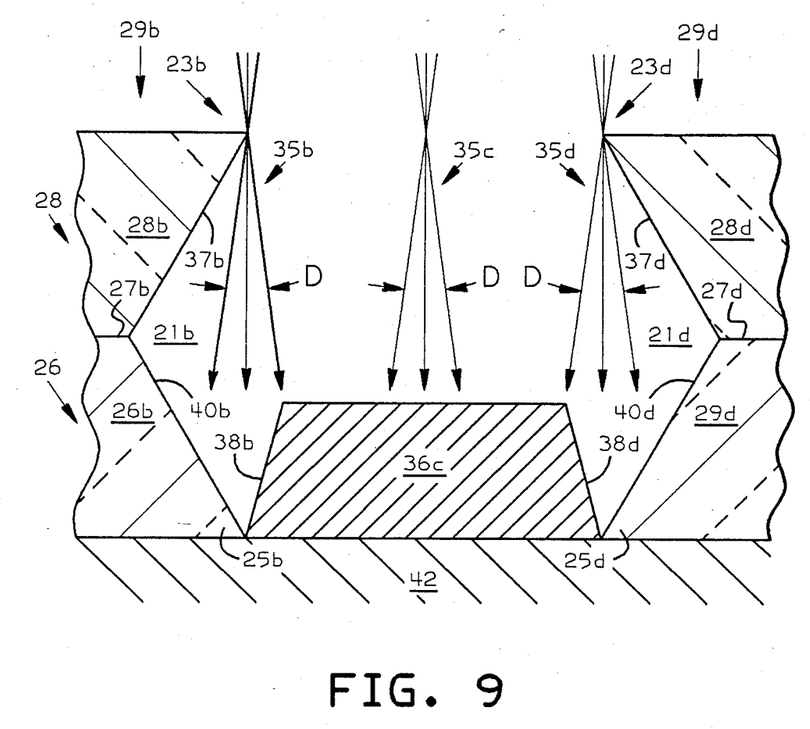
FIG. 9 is a side cross-sectional view of an aperture in the composite photoresist layers 26 and 28, illustrating the effect of the angular divergence of the beam of metal vapor atoms 35 in the formation of the resultant deposited metal structure 36c, in accordance with the invention.

For convenience, the photoresist structure made up of the positive photoresist portion 26b and the negative photoresist portion 28b will be referred to as the structure 29b and similarly, the positive photoresist portion 26d and the negative photoresist portion 28d will be referred to as the composite structure 29d. FIG. 9 provides a more detailed view of the sidewall region 21b of the composite structure 29b, showing that the sidewall portion 37b of the negative photoresist portion 28b has an undercut inclination providing a relief undercut from the image defining edge 23b at the upper extremity of the composite structure 29b. The sidewall 37b maintains its undercut inclination until it gets to the interface 27b between the negative photoresist portion 28b and the positive photoresist portion 26b. At the interface 27b, the sidewall 40b of the positive photoresist portion 26b has an upward facing inclination as is seen in FIG. 9, and the sidewall 40b extends in this manner from the interface 27b down to the bottom extremity 25b at the interface between the positive photoresist portion 26b and the substrate 42. (The substrate 42 is a generalized substrate which is used in this example to simplify the explanation of the invention.) As was discussed above, the solubility of the negative photoresist portion 28b in the aqueous alkaline developer was reduced in proportion to the quantity of ultraviolet light 32 which reached its respective level in the negative photoresist layer 28b. Since there is some absorption and scattering of the ultraviolet light 32 in FIG. 4 during the course of its penetration through the consecutively deeper layers of the upper, negative photoresist layer 28b, the topmost region of the negative photoresist layer 28b will have the greatest degree of insolubility of the aqueous alkaline developer. In contrast, the lowest portion of the negative photoresist layer 28b adjacent to the interface 27b will have a lesser energy density of ultraviolet light eaching it because of the absorption and scattering of the ultraviolet light 32 in the overlying portions of the layer 28b. Thus, the portion of the photoresist layer 28b adjacent to the interface 27b will have the greatest solubility of those portions of the negative photoresist in the layer 28b. Thus, when the negative photoresist layer 28b is exposed to the aqueous alkaline developer, the dissolution of the negative photoresist material at the sidewall 37b will proceed more slowly toward the top of the layer 28b and will proceed at a faster rate toward the interface 27b. Thus, the resulting undercut inclination of the sidewall 37b is formed.

The sidewall 40b of the positive photoresist layer 26b has an upward facing inclination because the solubility of the positive photoresist layer 26b is greater at those regions which are closer to the interface 27b and are relatively less soluble in those regions closer to the bottom of the positive photoresist layer 26b, adjacent to the substrate 42. This occurs because of the incremental absorption of the ultraviolet light 32 in the blanket exposure of FIG. 5B. Those layers of the positive photoresist portion 26b which are adjacent to the interface 27b receive a greater energy density of the ultraviolet light 34 than do those lower layers of the positive photoresist layer 26b adjacent to the substrate 42. Since the solubility of a positive photoresist is directly proportional to the energy density of light to which it is exposed, the solubility of the upper layers of the positive photoresist portion 26b adjacent to the interface 27b will be soluble in the aqueous alkaline developer than will be the lower layers adjacent to the substrate 42. Thus, when the sidewall 40b is exposed to the aqueous alkaline developer, the rate of dissolution is faster at the regions closer to the interface 27b than is the rate for those regions of the positive photoresist layer 26b which are lower and closer to the substrate 42.

Figure 7:
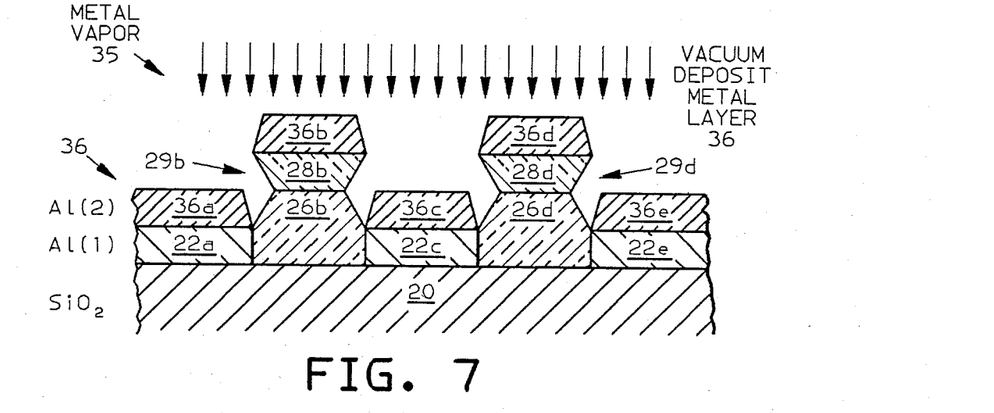
FIG. 7 is a side cross-sectional view of the photoresist structure shown in FIG. 6, as it can be used in a metal lift-off process, wherein a metal vapor 35 deposits metal atoms as the layer 36 of metal on the vertically exposed surfaces of the structure shown in FIG. 6.

The "hour glass" contour of the sidewalls for the composite structures 29b and 29d of FIG. 6 has very important consequences for the successful formation of vacuum deposited metal structures in lift-off processes such as is illustrated in FIGS. 7 and 8. In FIG. 7, the structure is placed in a vacuum evaporation chamber and a source of metal such as aluminum is evaporated forming the metal vapor 35. The aluminum atoms in the metal vapor 35 behave in a ballistic manner and thus a shadow of the projections 23b and 23d of the composite photoresist structures 29b and 29d can be projected onto the surface of the substrate upon which the structures 29b and 29d are formed. In FIG. 7, the photoresist structures 29b and 29d serve to allow the deposition of the metal vapor atoms 35 onto the exposed surfaces of the first layer of aluminum 22a, 22c and 22e, respectively depositing the second layer of aluminum 36a, 36c and 36e thereon. The portions 36b and 36d of the aluminum layer 36 deposited by the metal vapor 35 lie on top of the negative photoresist portions 28b and 28d, respectively. Then, as is conventional practice in metal lift-off processing techniques, the surplus metal portions 36b and 36d are removed by dissolving the photoresist composite structures 29b and 29d in a suitable solvent such as N-methylpyrrolidone, a standard photoresist stripping solvent. The structure can be immersed for approximately 10 minutes in the solvent and the photoresist structures will be dissolved. By using ultrasonic or mechanical agitation, the surplus metal portions 36b and 36d can be completely removed from the wafer. The resulting structure is shown in FIG. 8, where the open regions 24b and 24d are formed by the complete dissolution of the photoresist composite structures 29b and 29d in the solvent.

Figure 10:
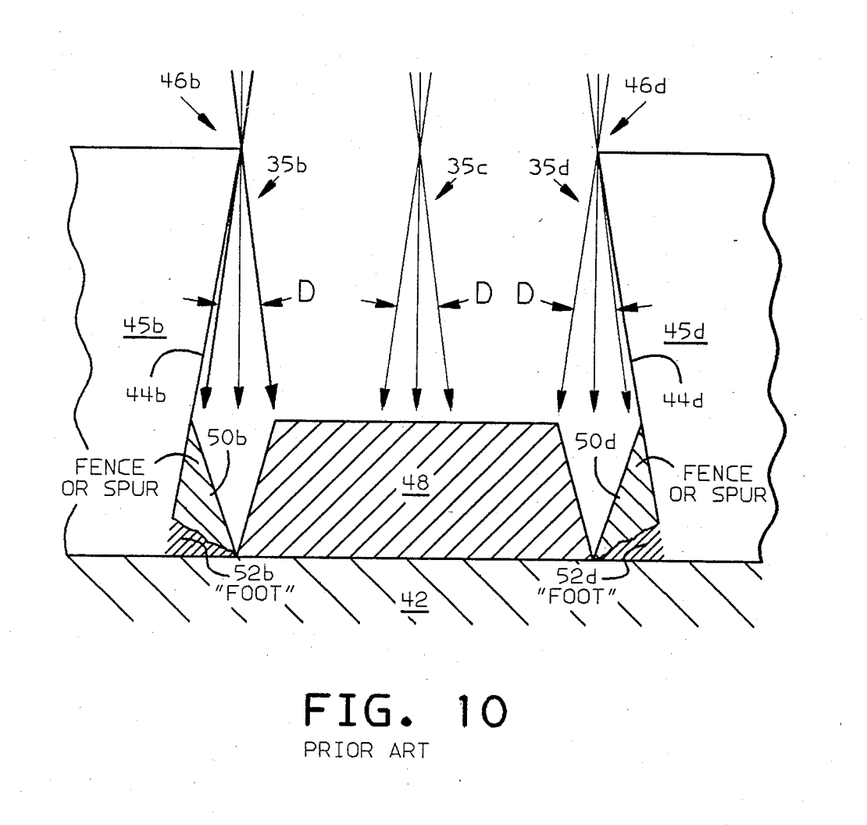
FIG. 10 is a side cross-sectional view of a prior art photoresist layer 45 showing the shape of the sidewalls in an aperture in the photoresist layer, and the effect of the angular divergence of the metal vapor atoms 35 in the formation of the undesired spur structure 50b and 50d on the sidewalls 44b and 44d of the photoresist material.

The importance of the hour glass contour to the sidewalls of the composite photoresist structures 29b and 29d can be more fully appreciated with reference to FIG. 9. In FIG. 9 is can be seen that the metal vapor 35 is actually not perfectly collimated in a parallel beam, but instead, the metal vapor atoms have an angular divergence D which can be seen in FIG. 9. The relief area 21b formed by the inclination of the sidewalls 37b and 40b of the composite photoresist structure 29b prevents the formation of unwanted fencing or spur structures which typically occur in prior art metal deposition processes when pushed to very small apertures dimensions. Reference to FIG. 10 will illustrate this prior art problem.

In FIG. 10, a prior art photoresist 45b and 45d has had formed therein an aperture exposing the underlying substrate 42. The sidewalls 44b and 44d are undercut at a relatively small angle. Oftentimes a "foot" 52b and 52d of the photoresist material will be left at the bottom of the aperture adjacent to the portions 45b and 45d. Since there is an angular divergence D to the atoms of the metal vapor 35, the portion of the metal vapor atoms 35b will impinge upon the foot 52b and will promote the growth of an unwanted fence or spur portion 50b upward along the sidewall 44b. A similar foot 52d on the bottom of the aperture adjacent to the photoresist 45d will promote the growth from the beam 35d of the fence or spur portion 50d upward along the sidewall 45d. The growth of such fence or spur structures creates shorting and dielectric punch-through problems in the final semiconductor product and substantially lowers the yield for such products.

Referring back to FIG. 9, the invention disclosed herein overcomes the tendency to form the foot or spur structure since the inclination of the lower sidewall 40b is relatively great and thus the fence or spur structures will not tend to grow along such a highly inclined sidewall. This is believed to be because the spur or fence structures grow in a direction parallel with the path of the atoms of the beam 35b. It can be seen in FIG. 10 that the prior art photoresist 45b has a sidewall inclination 44b which would allow the growth of such fence or spur structures along the direction of the path for the atoms in the beam 35b. When this is compared with the structure in FIG. 9 for the invention disclosed herein, it would not be possible for a spur or fence structure to grow along the sidewall 40b because the inclination of the sidewall 40b is substantially different in angular orientation from the path of the atoms in the beam 35b.

Figure 11:
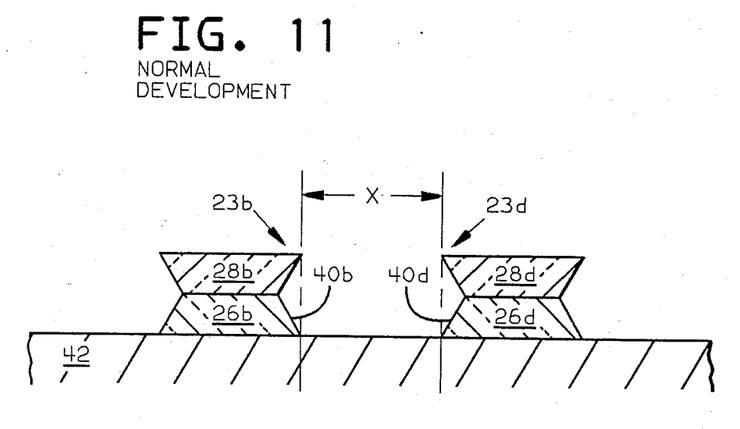
FIG. 11 is a side cross-sectional view of the composite photoresist layers 26 and 28, showing the relative position of the upper edges 23b and 23d for the aperture in the photoresist composite, as retaining the critical dimension X.
Figure 12:
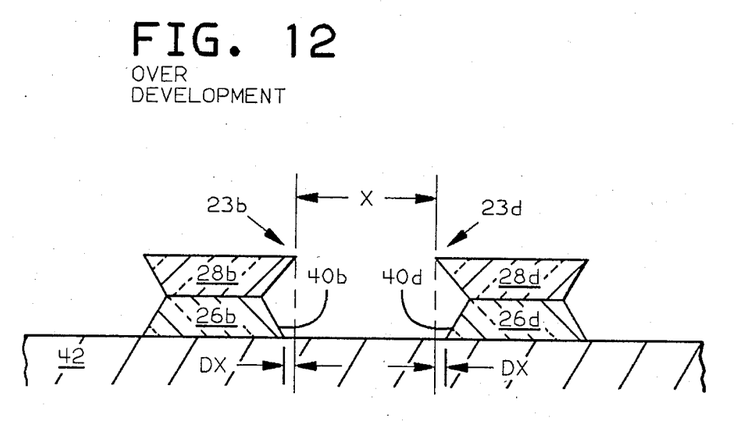
FIG. 12 is a side cross-sectional view of the composite photoresist layers 26 and 28 in accordance with the invention, and further illustrates the contour of the sidewall 40b and 40d in an aperture in the composite photoresist material, under the circumstance of over developing the photoresist structure, the figure illustrating that the upper edges 23b and 23d for the aperture in the photoresist composite retains a relative position which remains separated by the critical dimension X, thereby illustrating the relative insensitivity of the composite photoresist layers to over development.

FIGS. 11 and 12 show another advantage of the invention disclosed herein. The occurrence of a foot portion of photoresist remaining as a residue in the bottom of the aperture for prior art photoresist systems as shown in FIG. 10, has increased the practice of over developing the photoresist layer so as to assure the operator that residue of photoresists in the bottom of the aperture have been removed. However, this results in the problem of diminishing the well defined edge 46b and 46d in FIG. 10, which is necessary to enable the reproducible production of metal conductors 48 of a given horizontal dimension. The tolerances on the prior art conductors 48 deposited using photoresists which are over developed, become large enough to prevent the application of such photoresist systems to the formation of very fine line structures.

This problem is overcome by means of the relative insolubility of the negative photoresist layers 28b and 28d in FIG. 11. The upper extreme edge 23b of the structure 28b and 23d of the structure 28d defines the width of the aperture, X. In subsequent processing steps such as vacuum evaporation of metals or alternately ballistic type dry etching such as reactive ion etching, it is the position of the edges 23b and 23d which will define the horizontal dimension X of the process action at the bottom of the aperture, for example the effective width of the deposited metal structure at the bottom of the aperture. If the operator of the process is concerned that a residue of photoresist has formed in the bottom of the aperture, the operator will be free to over develop the composite photoresist to carry out the removal of any residual photoresist in the bottom of the aperture, and this will only result in the further dissolution of the sidewall portion 40b and 40d of the positive lower photoresist portion 26b and 26d shown in FIG. 12. The over development will not substantially effect the relative position of the edges 23b and 23d for the upper negative photoresist layers 28b and 28d, by virtue of their relative insolubility in the developer. As is seen in FIG. 12, the lower sidewall 40b can be dissolved back by a distance dx from the position of the edge 23b during an over development step, without any substantial adverse effects on the resultant effective horizontal dimension X for the deposited metal structure at the bottom of the aperture.

The photolithographic process described above also can be applied to the formation of masks for subtractive etching processes employing reactive ion etching. The aperture in the composite photoresist layers 26 and 28 of FIG. 9 has well defined upper edges 23b and 23d which enable precise control of the image size to be etched on the exposed portion of the substrate 42.

Although a specific embodiment of the invention has been disclosed, it will be understood by those of skill in the art that the foregoing and other changes in form and details may be made therein without departing from the spirit and the scope of the invention.

We claim:

1. A single development step, dual layer photoresist photolithographic process for forming hourglass shaped photoresist structures, comprising the steps of:
   depositing a first layer of positive photoresist having a base composition of a phenol-formaldehyde resin with a diazo-naphthoquinone sensitizer with a first solubility characteristic of becoming soluble in an aqueous alkaline developer solution after exposure to light and post baking;
   depositing a second layer of negative photoresist having said base composition plus the addition of a cross linking agent 1-hydroxyethyl-2-alkyl imidazoline on top of said first photoresist layer, having a second solubility characteristic of becoming insoluble to said developer solution after said exposure to light and said post baking;
   said positive photoresist and said negative photoresist mutually intermixing at said top of said first layer forming a gradation region where the solubility in said developer gradually changes from said first characteristic in the upper portion thereof to said second characteristic in the lower portion thereof;
   exposing said first and said second photoresist layers to a patterned light source;
   post baking said first and said second photoresist layers;
   flood exposing said first and said second photoresist layers without a pattern to the flooding light;
   developing said first and said second photoresist layers in said developer solution;
   whereby a composite photoresist structure consisting of said first and said second layers of photoresist will remain in those regions exposed to said patterned light source, said structure having well-defined upper edges and a recessed contour near the interface of said first and said second photoresist layers forming an hourglass shaped photoresist structure.

2. The method of claim 1 which further comprises:
   the energy density of said patterned light source having a first magnitude and the energy density of said flood exposure light having approximately four times said first magnitude.

* * * * *